United States Patent [19]

Shu

[11] Patent Number: 5,616,035
[45] Date of Patent: Apr. 1, 1997

[54] ELECTRICAL CONNECTOR

[75] Inventor: Shinzui Shu, Kawasaki, Japan

[73] Assignee: Berg Technology, Inc., Reno, Nev.

[21] Appl. No.: 525,581

[22] PCT Filed: Mar. 31, 1994

[86] PCT No.: PCT/US94/03560

§ 371 Date: Sep. 19, 1995

§ 102(e) Date: Sep. 19, 1995

[30] Foreign Application Priority Data

Mar. 31, 1993 [JP] Japan .................. 5-015919 U

[51] Int. Cl.⁶ ..................................... H01R 9/09
[52] U.S. Cl. .................. 439/79; 439/83; 439/572
[58] Field of Search ................... 439/78, 79, 83, 439/569, 572

[56] References Cited

U.S. PATENT DOCUMENTS 4,583,807  4/1986  Kaufman et al. .
4,802,862  2/1989  Seidler ........................... 439/83
5,029,748  7/1991  Lauterbach et al. ............. 228/180.1

Primary Examiner—Khiem Nguyen
Attorney, Agent, or Firm—Woodcock Washburn Kurtz Mackiewicz & Norris

[57] ABSTRACT

An electrical connector 12 is provided which can be fixed to a printed circuit board 10 through the utilization of an automatic soldering station. A peg 16 is projected from a housing body 14 of the connector 12 and inserted through an insertion hole 28 of the printed circuit board 10. A solderable conductor 30 is arranged around an insertion hole 28 on the solder side 10b of the board 10. A cylindrical metal ring 32 is fitted over the peg 16. The cylindrical metal ring 32 has a wedge-like projection 34 on its inner wall which bites into the peg 16 thus fixing the ring 32 to the peg 16. When the board 10 is subjected to an automatic soldering operation, a solder connection is achieved between the conductor 30 of the board 10 and the cylindrical metal ring 32 fitted over the peg 16, thereby fixing the connector 12 to the board 10.

23 Claims, 5 Drawing Sheets

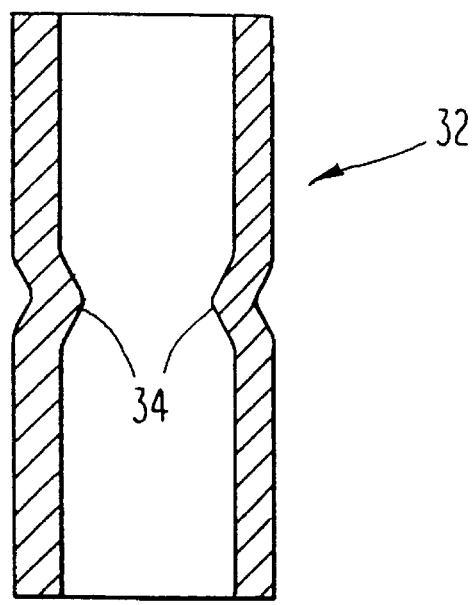
_Fig. 3_
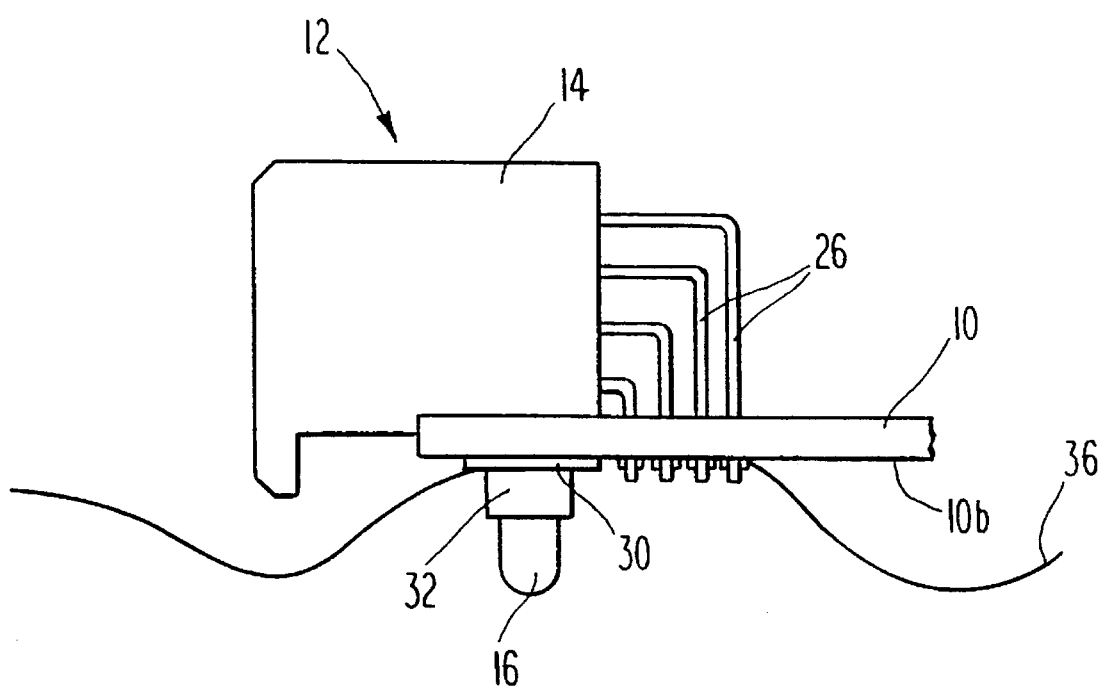
_Fig. 4_

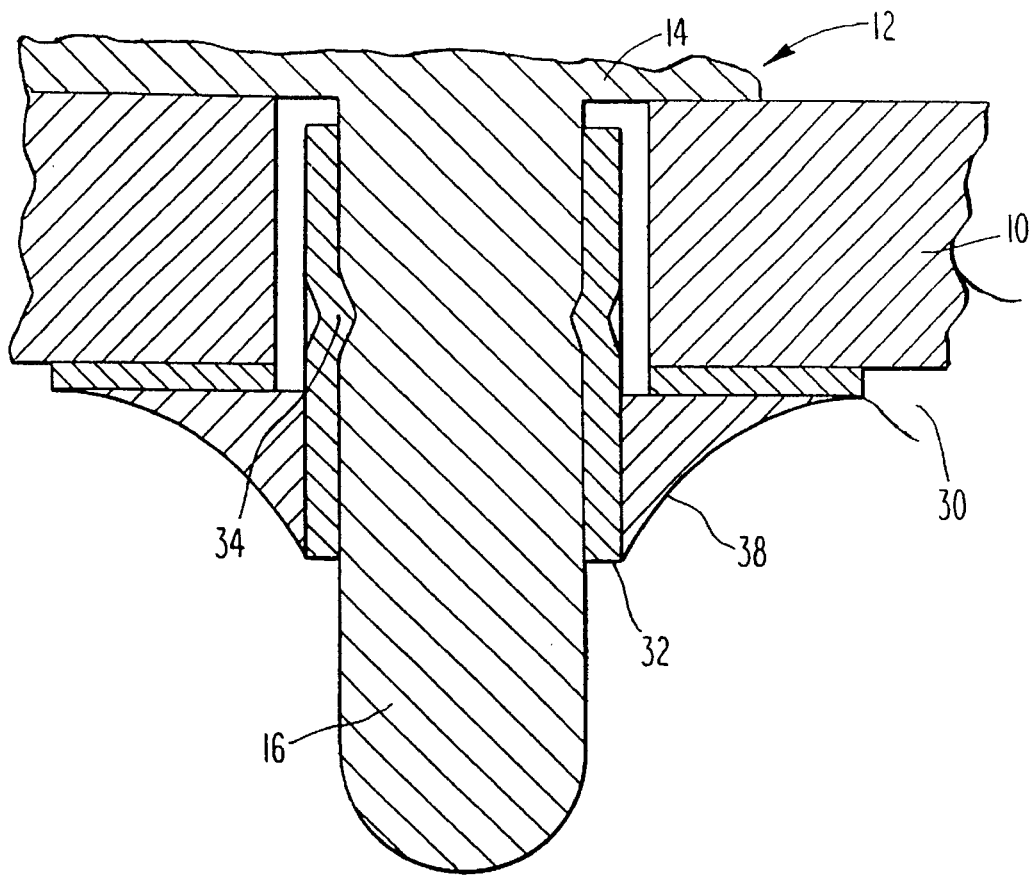
_Fig. 5_
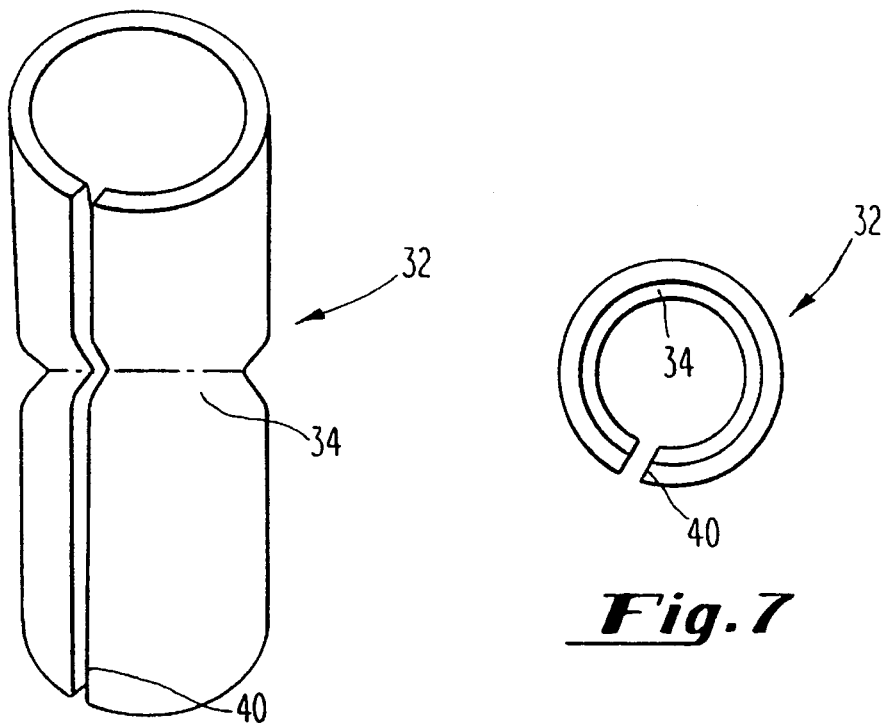
_Fig. 6_
_Fig. 7_

ELECTRICAL CONNECTOR

FIELD OF THE INVENTION

The present invention relates to an electrical connector and, in particular, to an electrical connector of a type solderable to a board such as a printed circuit board.

BACKGROUND OF THE INVENTION

A method, referred to in the art as "hot riveting", is known for fixing an electrical connector to a printed circuit board. The hot riveting method involves the use of a connector housing comprising a housing body made of plastic and a plastic peg (leg) downwardly extending from the lower surface of the housing body. To fix the connector to the circuit board, the peg is inserted through a peg insertion bore in the printed circuit board until the lower surface of the housing body lies flat on the board surface. Then, the distal end of the peg, which protrudes from the insertion bore on the opposite side of the circuit board, is contacted with a mold taking surface of a heated mold pushing rod so as to melt and deform the peg. The mold taking surface of the mold pushing rod has a spherical recess with a greater diameter than that of the insertion bore in the board. As a result, the distal end of the peg is spherically deformed to a diameter greater than that of the insertion hole, thereby fixing the connector to the board.

Unfortunately, however, the peg does not always deform to the predetermined spherical shape of the mold taking surface due to the nonuniformity of heat conduction from the mold pushing rod to the peg or due to the nonuniformity, etc., of the inner mechanical properties of the peg resulting from the nonuniform hardness of the resin inside the peg. In such cases, the housing-to-board connection force becomes unstable, thus posing a reliability problem.

Additionally, with the prior art hot riveting method, it is often necessary to design or adjust the dimension of the peg in accordance with different insertion hole diameters in the board. The melting means, such as the mold pushing rod, must also be adjusted. Therefore, the manufacturing and mounting operations become more complex.

An object of the present invention is to provide an electrical connector which can readily and positively be fixed to a board, such as a printed circuit board, and can eliminate the necessity of providing any melting means, such as a mold pushing rod.

It is also another object of the present invention to provided an electrical connector which requires less design restriction to the peg and requires no adjustment of the peg.

SUMMARY OF THE INVENTION

In order to achieve the aforementioned objectives, there is provided an electrical connector to be soldered to a board having a through hole. The electrical connector comprises a housing body to be attached on one surface of the board. A plurality of contact terminals are arranged in the housing body for electrically connecting the electrical connector to the board. A peg is projected from the housing body and adapted to fit through the through hole. The peg has a solder means to enable the peg to be soldered to the opposite side of the circuit board. Thus, when the housing body is placed on the surface of the board, the peg extends through the through hole in the board and protrudes outward from the opposite surface of the board. The protruding portion of the peg is then soldered to the board, thereby fixing the housing body to the board.

According to one embodiment of the present invention, the peg is soldered to the circuit board by means of a cylindrical metal ring fitted over the peg and through the through hole in the circuit board such that it occupies the space between the peg and the surface of the through hole. In another embodiment, the solder means may comprise a solderable coating formed on the peg. Preferably, the peg is soldered to the board during the same soldering step as the plurality of contact terminals.

Other features and advantages of the present invention will become evident hereinafter.

BRIEF DESCRIPTION OF THE DRAWINGS

The foregoing summary, as well as the following detailed description of the preferred embodiments, is better understood when read in conjunction with the appended drawings. For the purpose of illustrating the invention, there is shown in the drawings embodiments that are presently preferred, it being understood, however, that the invention is not limited to the specific methods and instrumentalities disclosed. In the drawings:

FIG. 3 is an enlarged cross-sectional view of the cylindrical metal ring of FIG. 1;

FIG. 4 is a side view showing the electrical connector set in a soldering bath at an automatic soldering station;

FIG. 5 is a cross-sectional view showing a solder-connected area between an annular ring of the board and the cylindrical metal ring of the electrical connector of FIG. 4;

FIG. 6 is a perspective view showing a cylindrical metal ring in accordance with a second embodiment of the present invention;

FIG. 7 is a top view of the metal ring of FIG. 6;

DETAILED DESCRIPTION OF THE PREFERRED EMBODIMENTS

Figure 1:
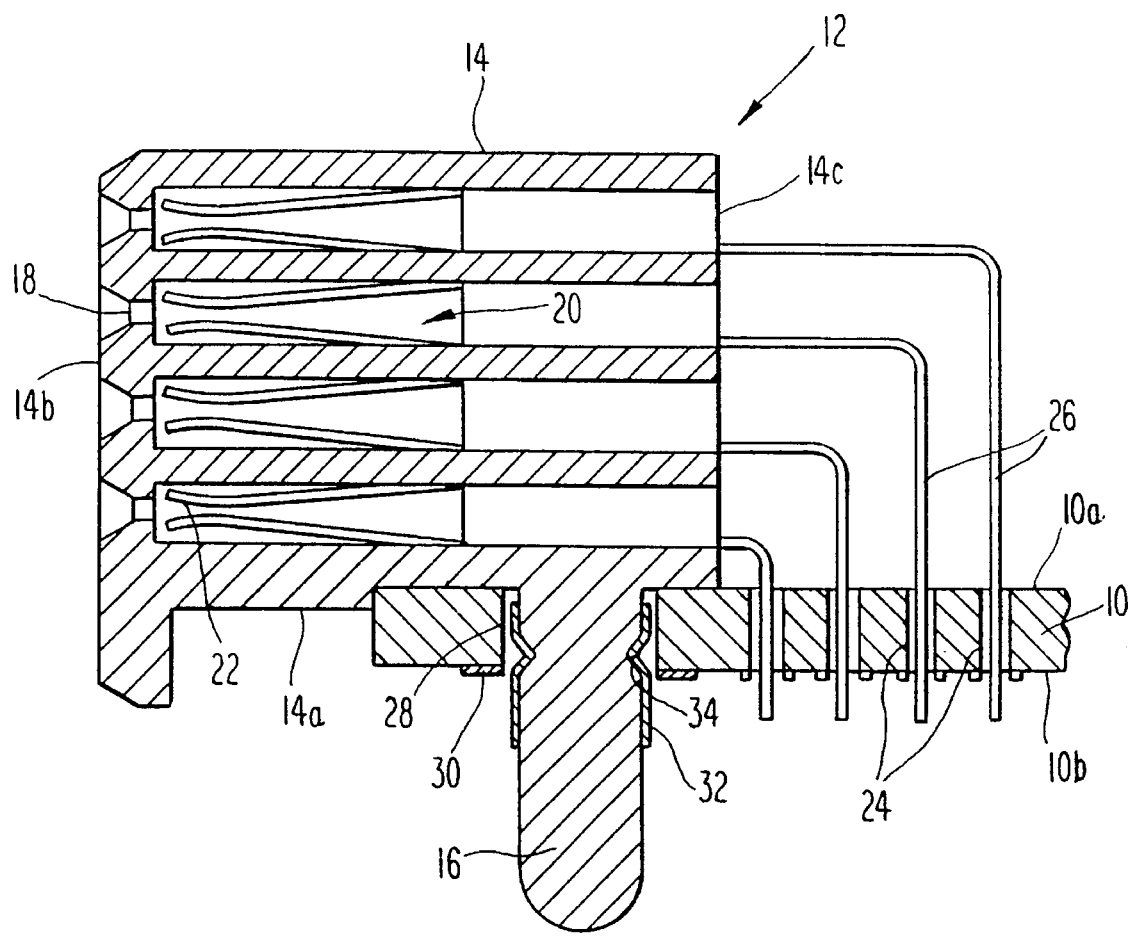
FIG. 1 is a cross-sectional view showing an electrical connector according to a first embodiment of the present invention.

Referring to the drawings, FIG. 1 shows an electrical connector 12 in accordance with one embodiment of the present invention. Here, the electrical connector 12 comprises a receptacle connector (i.e., a female connector such as an outlet connector and socket) that is to be mounted on a main side 10a of a printed circuit board 10.

The receptacle connector 12 is equipped with a receptacle housing made of an electrically insulating resin material and connectable to a male plug connector (not shown). The receptacle housing is equipped with a housing body 14 of substantially rectangular configuration. The housing body 14 has a rod-like peg 16 formed integral with the housing body 14.

A front part of the lower surface 14a of the housing body 14 extends past an edge of the board 10, while the remaining portion of the lower surface 14a of the housing body 14 lies flat on the main side 10a of the board 10. A front wall 14b of the housing body 14 is situated substantially perpendicular to the lower surface 14a. The front wall 14b has openings 18 communicating with the inside of the body 14. Solder tails 26, described hereinafter in greater detail, are projected from a rear wall 14c of the housing body 14.

A plurality of receptacle contacts 20 are arranged in corresponding openings 18. The receptacle contacts 20 have receptacle sections 22 for receiving plug contacts (not shown) of a male contact member (not shown) via the front wall 14b of the housing 14. The receptacle sections 22 may be designed so as to correspond to the configuration of the plug contacts, and are not restricted to the particular configuration shown. Each receptacle contact 20 further has a solder tail 26 that inserts into, and is subsequently soldered to, a corresponding through hole 24 of a circuit pattern on the printed circuit board 10.

Figure 2:
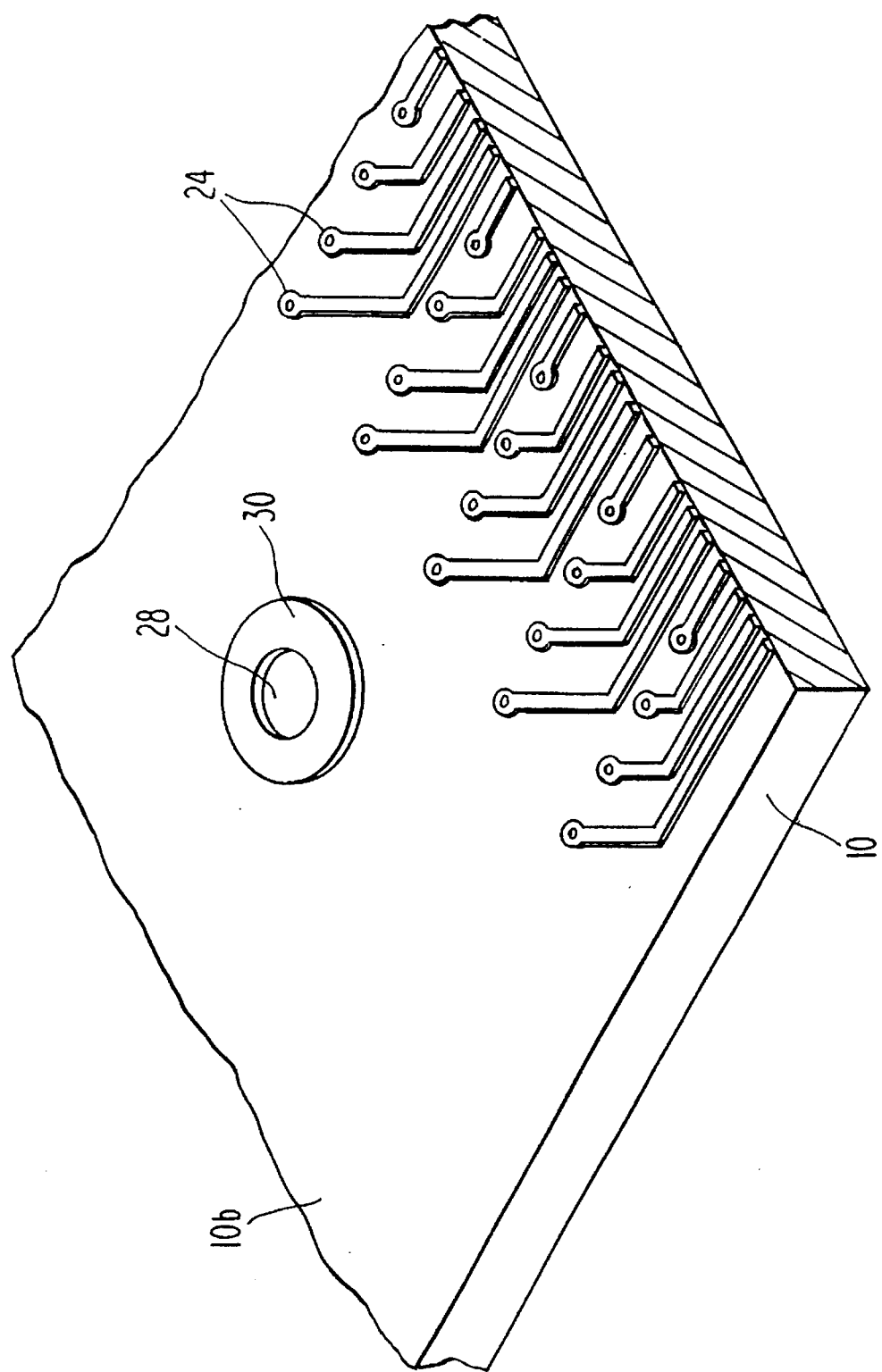
FIG. 2 is a perspective view showing a soldering side of the printed circuit board of FIG. 1.

As further shown, the peg 16 projects vertically from the lower surface 14a of the housing body 14 and extends through an insertion hole 28. The distal end of the peg 16 protrudes outward from the hole 28 on the opposite, solder side 10b of the printed circuit board 10. As best shown in FIG. 2, an annular ring 30, which is made of a conductive material or a solderable material, is located around the peg insertion hole 28 on the solder side 10b of the board 10.

Referring back to FIG. 1, a substantially cylindrical metal ring 32 is fitted over the peg 16. A portion of the cylindrical metal ring 32 extends into the peg insertion hole 28 so as to be disposed between the peg 16 and the annular surface of the hole 28.

As shown in FIG. 3, an annular projection 34 is formed on the inner surface of the cylindrical metal ring 32 and extends toward the center axis of the cylindrical metal ring. It is desirable that the cross-sectional configuration of the annular projection 34 be, for example, V-shaped or wedge-shaped and have a projected end oriented toward the center axis of the cylindrical metal ring 32.

The cylindrical metal ring 32 has an outer diameter of a size insertable into the peg insertion hole 28. The inner diameter of the cylindrical metal ring 32 is of such a size as to allow the metal ring to be fitted over the peg 16. At the area of the annular projection 34, the inner diameter of the cylindrical metal ring 32 is made smaller than the outer diameter of the peg 16.

When the cylindrical metal ring 32 is press fitted over the peg 16, the area of the annular projection 34 on the cylindrical metal ring 32 receives a radial expansion force from the outer periphery of the peg 16 which acts against the normal tendency of the metal ring 32 to return, under its own elasticity, back to its original state. As a result of these opposing forces, the annular projection 34 bites into the peg 16 and hence the peg 16 is held in place. By so doing, the cylindrical metal ring 32 is fixed in place on the peg 16 and will not drop off the peg 16 under any slight oscillation or external force. If the cross-sectional shape of the annular projection is so formed as to have a pointed end as in the present embodiment, then the pointed end of the annular projection bites more forcibly into the peg 16, thus enabling it to be more firmly secured to the peg 16.

FIGS. 4 and 5 show the receptacle connector 12 in a soldering bath at an automatic soldering station. Here the solder tails 26 of the contacts 20 are inserted through the corresponding through holes 24 in the board 10 and the metal ring 32 is fitted over the peg 16. In the soldering bath, the solder side 10b of the board 10 is exposed to a molten solder wave 36 jetted in a wavy manner. By action of the solder wave 36, the solder tails 26 are soldered to their corresponding through holes 24. At the same time, a solder connection area 38 (FIG. 5) is formed between the angular ring 30 on the solder side 10b of the board 10 and the metal ring 32, thereby soldering the two together. During the soldering operation, the peg 16, being made of a resin material, is softened by heat (about 250° to 260° C.) from the solder wave 36. As a result, the annular projection 34 on the inner surface of the metal ring 32 bites more forcibly into the peg 16, thus fixing the metal ring 32 to the peg 16 with a stronger force. The soldering of the annular ring 30 to the metal ring 32 firmly fixes the connector 12 to the board 10.

FIGS. 6 and 7 show a second embodiment of the present invention. This embodiment is similar to the first embodiment except that the structure of the metal ring 32 is different. In particular, in the second embodiment the metal ring 32 has a slit 40 along its axial direction. The slit 40 allows the metal ring 32 to expand more easily in the radial direction, thus facilitating the fitting of the metal ring 32 over the peg 16.

Figure 8:
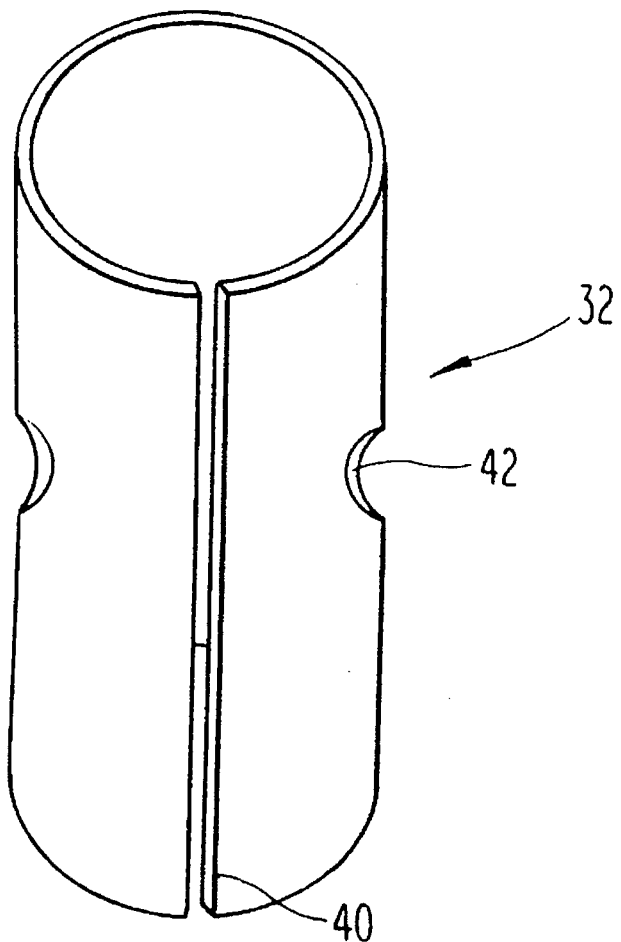
FIG. 8 is a perspective view of a cylindrical metal ring in accordance with a third embodiment of the present invention.
Figure 9:
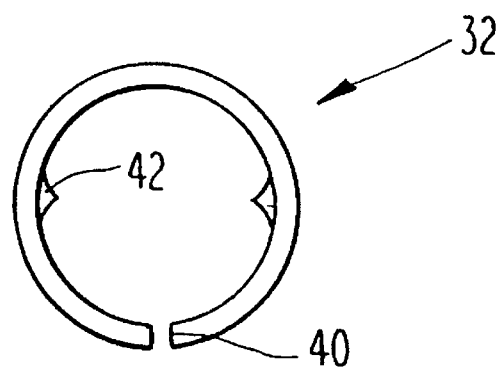
FIG. 9 is a top view of the metal ring of FIG. 8.

FIGS. 8 and 9 show a third embodiment of the present invention. The third embodiment differs from the first embodiment in that the metal ring 32 of the third embodiment has a plurality of projections 42, in place of the aforementioned annular projection 34, which are provided at given intervals along the inner wall of the metal ring 32. It is preferred that the cross-sectional shape of each projection 42 have a pointed end projected toward the center axis of the metal ring 32, such as a V-shaped or wedge-like end. Further a slit 40 may be provided as in the case of the second embodiment.

In the respective embodiments set out above, the receptacle connector 12 is fixed to the board 10 mainly by the metal ring 32, and the design tolerance can be more lenient for the peg 16. It is therefore easy to mold the housing body 14 integral with the peg 16.

If there is no particular design limitation on the peg 16, it may be possible to solder the peg 16 directly to the annular ring 30 of the board 10, instead of interposing the metal ring 32, by partially coating the peg 16 with a material with which the peg 16 can be soldered. Or it may be possible to manufacture the peg 16 itself from a solderable material. In this case, the housing body 14 and peg 16 are connected together by a proper method in place of being formed integral with each other. In the case where the peg 16 is made of a conductive material, it is of course necessary to electrically insulate the contacts 20 and peg 16 from each other. In any case, the softening of the peg 16 is achieved automatically by the soldering operation, and therefore, it is not necessary to use any melting means such as a conventional mold pushing rod.

Although in the aforementioned respective embodiments the receptacle connector 12 has been explained as being mounted on the printed circuit board 10, the present invention is not restricted thereto. The present invention can be applied to an electrical connector of any proper type necessary to be fixed to a board. Moreover, the shapes of the housing body and contacts are not limited to those disclosed in the Figures, nor are the shapes of the metal ring 32, projections 34, 42 and slit 40. It is understood, therefore, that changes may be made to the embodiments described above without departing from the broad inventive concepts thereof. Accordingly, this invention is not limited to the particular embodiments disclosed, but is intended to cover all modifications that are within the scope and spirit of the invention as defined by the appended claims.

What is claimed is:

1. An electrical connector to be automatically soldered to a circuit board having a through hole, said electrical connector comprising:

a housing body to be positioned on one side of the circuit board;

a plurality of contact terminals arranged in the housing body; and a plastic peg projecting from a surface of the housing body and adapted to project through the through hole on the circuit board when the housing body is placed on said one side of the circuit board, said plastic peg having solder means for securing said peg to the circuit board during a soldering step thereby fixing the electrical connector in place on the circuit board.

2. An electrical connector according to claim wherein said plastic peg is formed integrally with said housing body.

3. An electrical connector according to claim 1 wherein said solder means comprises a solderable coating formed on said plastic peg.

4. An electrical connector according to claim 1 wherein said solder means comprises a cylindrical metal ring adapted to fit over the plastic peg and through the through hole.

5. An electrical connector according to claim 4 wherein the cylindrical metal ring has a slit formed therein along its axial direction to facilitate fitting the metal ring over the peg.

6. An electrical connector according to claim 4 wherein the cylindrical metal ring has at least one projection formed on an inner surface thereof, said at least one projection being adapted to bite into the peg when the metal ring is fitted over the peg, thereby fixing the ring to the peg.

7. An electrical connector according to claim 6 wherein said at least one projection comprises an annular projection formed about the inner surface of the cylindrical ring.

8. An electrical connector according to claim 6 wherein said at least one projection comprises a plurality of separate projections spaced about the inner surface of the cylindrical metal ring.

9. An electrical connector according to claim 6 wherein said at least one projection is V-shaped.

10. An electrical connector to be automatically soldered to a circuit board having a through hole, said electrical connector comprising:

a housing body to be positioned on one side of the circuit board;

a plurality of contact terminals arranged in the housing body;

a peg projecting from a surface of the housing body and adapted to project through the through hole on the circuit board when the housing body is placed on said one side of the circuit board; and a cylindrical metal ring adapted to fit over the peg and through the through hole when the housing body is placed on the circuit board, said cylindrical metal ring providing a means for soldering the peg to the opposite side of the circuit board to fix the electrical connector in place on the circuit board.

11. An electrical connector according to claim 10 wherein said peg is formed integrally with said housing body.

12. An electrical connector according to claim 10 wherein the cylindrical metal ring has a slit formed therein along its axial direction to facilitate fitting the metal ring over the peg.

13. An electrical connector according to claim 10 wherein the cylindrical metal ring has at least one projection formed on an inner surface thereof, said at least one projection being adapted to bite into the peg when the metal ring is fitted over the peg, thereby fixing the ring to the peg.

14. An electrical connector according to claim 13 wherein said at least one projection comprises an annular projection formed about the inner surface of the cylindrical ring.

15. An electrical connector according to claim 13 wherein said at least one projection comprises a plurality of separate projections spaced about the inner surface of said ring.

16. An electrical connector according to claim 13 wherein said at least one projection is V-shaped.

17. A method of fixing an electrical connector to a circuit board wherein said connector comprises a housing body having a peg projecting from a surface thereof and wherein said circuit board has a through hole, said method comprising the steps of:

a) positioning the electrical connector on one side of the circuit board such that said peg is inserted through said through hole;

b) fitting a metal ring over said peg; and c) applying a soldering operation to the opposite side of the circuit board, whereby said metal ring fitted over said peg is soldered to said opposite side of the circuit board thereby fixing the electrical connector to the circuit board.

18. The method of claim 17 wherein said metal ring comprises a cylindrical metal ring.

19. The method of claim 17 wherein said peg is formed integrally with said housing body.

20. The method of claim 19 wherein said peg is formed of a plastic material.

21. The method of claim 17 wherein the metal ring has a slit formed therein along its axial direction to facilitate fitting the metal ring over the peg.

22. The method of claim 17 wherein the metal ring has at least one projection formed on an inner surface thereof, said at least one projection being adapted to bite into the peg when the metal ring is fitted over the peg, thereby fixing the ring to the peg.

23. The method of claim 22 wherein said at least one projection comprises an annular projection formed about the inner surface of the ring.

* * * * *

UNITED STATES PATENT AND TRADEMARK OFFICE
CERTIFICATE OF CORRECTION

PATENT NO. : 5,616,035
DATED :
INVENTOR(S) : April 1, 1997
Shinzui Shu

It is certified that error appears in the above-indentified patent and that said Letters Patent is hereby corrected as shown below:

Column 5, Line 16 - After "claim" the number "1" should appear.

Signed and Sealed this

Fifth Day of August, 1997

Attest:

BRUCE LEHMAN

Attesting Officer      Commissioner of Patents and Trademarks